United States Patent
Kim et al.

(10) Patent No.: US 11,411,054 B2
(45) Date of Patent: Aug. 9, 2022

(54) PAD AREA WITH MULTIPLE CONDUCTIVE LAYERS AND DISPLAY APPARATUS INCLUDING THE SAME

(71) Applicant: Samsung Display Co., Ltd., Yongin-si (KR)

(72) Inventors: Jungtae Kim, Yongin-si (KR);
Dongyoon So, Yongin-si (KR);
Youngrae Kim, Yongin-si (KR);
Kyungmin Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 158 days.

(21) Appl. No.: 16/877,584

(22) Filed: May 19, 2020

(65) Prior Publication Data
US 2020/0395419 A1  Dec. 17, 2020

(30) Foreign Application Priority Data
Jun. 13, 2019  (KR) .................. 10-2019-0070072

(51) Int. Cl.
*H01L 27/32* (2006.01)
*H01L 27/12* (2006.01)

(52) U.S. Cl.
CPC ...... *H01L 27/3223* (2013.01); *H01L 27/1244* (2013.01); *H01L 27/3244* (2013.01); *H01L 27/3276* (2013.01)

(58) Field of Classification Search
CPC ............. H01L 27/3276; H01L 27/3244; H01L 27/3223; H01L 27/1244
See application file for complete search history.

(56) References Cited

U.S. PATENT DOCUMENTS

| | | | |
|---|---|---|---|
| 8,637,894 B2* | 1/2014 | Lee | H01L 27/3276 257/99 |
| 8,817,217 B2 | 8/2014 | Kwak | |
| 2013/0056726 A1* | 3/2013 | Chae | H01L 27/3276 257/43 |
| 2014/0319471 A1* | 10/2014 | Kim | H01L 22/32 257/40 |

(Continued)

FOREIGN PATENT DOCUMENTS

| KR | 1020010008892 A | 2/2001 |
|---|---|---|
| KR | 1020120066822 A | 6/2012 |

(Continued)

*Primary Examiner* — Michael M Trinh
(74) *Attorney, Agent, or Firm* — Cantor Colburn LLP

(57) ABSTRACT

A display apparatus includes: a substrate including a thin-film transistor including an electrode, a non-display area, and a pad area including a lower and an upper conductive layer facing each other with an insulating layer therebetween. The lower conductive layer includes: a first conductive layer defining an end surface of the display apparatus, and a second conductive layer spaced apart from the first conductive layer to define a space between the first and second conductive layers, the insulating layer defines a first opening portion corresponding to the space, and the upper conductive layer is in a same layer as the electrode of the thin-film transistor, the upper conductive layer extending into the first opening portion corresponding to the space between the first and second conductive layers.

26 Claims, 9 Drawing Sheets

(56) References Cited

U.S. PATENT DOCUMENTS

| | | | |
|---|---|---|---|
| 2015/0144915 A1* | 5/2015 | Lee | G02F 1/1309 |
| | | | 257/40 |
| 2016/0204184 A1* | 7/2016 | Park | H01L 27/124 |
| | | | 257/71 |
| 2016/0218165 A1 | 7/2016 | Park et al. | |
| 2017/0288009 A1 | 10/2017 | Kim et al. | |
| 2018/0061895 A1* | 3/2018 | Kim | H01L 27/322 |
| 2018/0095584 A1 | 4/2018 | Lee et al. | |
| 2019/0198589 A1* | 6/2019 | Choi | H01L 27/3246 |
| 2019/0221584 A1* | 7/2019 | Kang | H01L 29/78645 |
| 2020/0006452 A1* | 1/2020 | Lee | H01L 27/3276 |

FOREIGN PATENT DOCUMENTS

| | | |
|---|---|---|
| KR | 1020160091529 A | 8/2016 |
| KR | 1020170114040 A | 10/2017 |
| KR | 1020180025523 A | 3/2018 |
| KR | 1020180132010 A | 12/2018 |

\* cited by examiner

PAD AREA WITH MULTIPLE CONDUCTIVE LAYERS AND DISPLAY APPARATUS INCLUDING THE SAME

This application claims priority to Korean Patent Application No. 10-2019-0070072, filed on Jun. 13, 2019, and all the benefits accruing therefrom under 35 U.S.C. § 119, the disclosure of which is incorporated herein in its entirety by reference.

BACKGROUND

1. Field

One or more embodiments relate to an electronic apparatus, and more particularly, to a display apparatus.

2. Description of Related Art

As the information society has developed, various demands for display apparatuses for displaying an image have increased. In the field of display apparatuses, a cathode ray tube ("CRT") having a large volume has been replaced by a flat panel display ("FPD") device, which is relatively thin and light and capable of having a large display area. The FPD device may include a liquid crystal display ("LCD") device, a plasma display panel ("PDP") device, an organic light-emitting display ("OLED") device, an electrophoretic display ("EPD") device, etc.

After these display apparatuses are manufactured, an operation of the display apparatuses may be tested such as using a test pad.

SUMMARY

A test pad for testing an operation of a display apparatus after manufacturing thereof, may be arranged on a display substrate of the display apparatus. Since a dead space of a display apparatus has been reduced, the test pad may be arranged outside a display area of the display substrate. After the operation of the display apparatus is tested, the test pad may be separated from a remainder of the display substrate by performing laser trimming, etc.

One or more embodiments provide a display apparatus including a pad area having high reliability.

Additional features will be set forth in part in the description which follows and, in part, will be apparent from the description, or may be learned by practice of the embodiments of the disclosure.

According to one or more embodiments, a display apparatus includes: a substrate including a thin-film transistor including an electrode, a non-display area, and a pad area including a lower and an upper conductive layer facing each other with an insulating layer therebetween. The lower conductive layer includes: a first conductive layer defining an end surface of the display apparatus, and a second conductive layer spaced apart from the first conductive layer to define a space between the first and second conductive layers, the insulating layer defines a first opening portion corresponding to the space, and the upper conductive layer is in a same layer as the electrode of the thin-film transistor, the upper conductive layer extending into the first opening portion corresponding to the space between the first and second conductive layer.

The upper conductive layer may be connected to the first conductive layer at a first contact hole and connected to the second conductive layer at a second contact hole.

The insulating layer may include a first insulating layer and a second insulating layer.

The first opening portion may include a first insulating opening portion of the first insulating layer and a second insulating opening portion of the second insulating layer, and the first insulating opening portion and the second insulating opening portion may be connected to each other.

The display area may further include a gate electrode facing the electrode with both a gate insulating layer and an interlayer insulating layer therebetween, and a semiconductor layer facing the gate insulating layer with the gate electrode therebetween. The insulating layer may include a first insulating layer in a same layer as the gate insulating layer and a second insulating layer in a same layer as the interlayer insulating layer.

The display apparatus may further include a lower insulating layer between the first conductive layer and the substrate.

The display apparatus may further include a protective layer arranged on the upper conductive layer to at least partially overlap the upper conductive layer and including an organic material.

The first conductive layer and the second conductive layer may be arranged in different layers from each other.

The display area may further include a gate electrode facing the electrode with both a gate insulating layer and an interlayer insulating layer therebetween, and a semiconductor layer facing the gate insulating layer with the gate electrode therebetween, the insulating layer may include a first insulating layer in a same layer as the gate insulating layer and a second insulating layer in the same layer as the interlayer insulating layer, the first insulating layer disposed between the substrate and the second conductive layer and the second insulating layer facing the first insulating layer with the second conductive layer therebetween.

The display apparatus may further include a lower insulating layer and a buffer layer between the first insulating layer and the substrate. The buffer layer may define a buffer opening portion corresponding to the space, the lower insulating layer may define a lower opening portion corresponding to the space, the buffer opening portion and the lower opening portion may be connected to each other, and the upper conductive layer may be arranged at the buffer opening portion and the lower opening portion by surrounding upper surfaces and side surfaces of the first conductive layer and the second conductive layer.

The display apparatus may further include a third conductive layer arranged below the second conductive layer. The third conductive layer is arranged to be closer to the display area than the second conductive layer.

The display apparatus may further include a lower insulating layer between the first conductive layer and the substrate.

According to one or more embodiments, a display apparatus includes: a substrate including a display area, a non-display area; and a pad area in the non-display area and including a lower conductive layer, an insulating layer, and an upper conductive layer. The lower conductive layer includes a first conductive layer including a side surface in the same plane as a side surface of the insulating layer and a second conductive layer apart from the first conductive layer, the insulating layer includes an outer insulating layer on the first conductive layer and an inner insulating layer on the second conductive layer, and the upper conductive layer is on the outer insulating layer and the inner insulating layer and is integrally arranged along a side surface of the outer insulating layer and a side surface of the inner insulating layer.

The outer insulating layer may define a first contact hole exposing the first conductive layer, the inner insulating layer may define a second contact hole exposing the second conductive layer, and the upper conductive layer may be connected to the first conductive layer at the first contact hole and may be connected to the second conductive layer at the second contact hole.

The outer insulating layer may include a first outer insulating layer and a second outer insulating layer, and the inner insulating layer may include a first inner insulating layer and a second inner insulating layer.

The display apparatus may further include a planarization layer arranged on the upper conductive layer to at least partially overlap the upper conductive layer.

The display apparatus may further include a lower insulating layer between the first conductive layer and the substrate, and the upper conductive layer and the lower insulating layer may at least partially contact each other.

The display apparatus may further include the first conductive layer and the second conductive layer different layers from each other with the insulating layer therebetween.

The display apparatus may further include a first lower insulating layer between the first conductive layer and the substrate and a second lower insulating layer between the second conductive layer and the first lower insulating layer, and the first conductive layer.

The display apparatus may further include an outer lower layer between the first conductive layer and the substrate and an inner lower layer between the second conductive layer and the substrate. The upper conductive layer may be connected to the first conductive layer and the second conductive layer and may be arranged along a side surface of the outer lower layer and a side surface of the inner lower layer.

The display apparatus may further include a third conductive layer between the display area and the second conductive layer. The third conductive layer may be in a same layer as the first conductive layer and the third conductive layer may be connected to the upper conductive layer at a third contact hole of the insulating layer.

A lower insulating layer may be between the third conductive layer and the substrate, and the third conductive layer and the lower insulating layer may contact each other.

According to one or more embodiments, a display apparatus includes: a substrate including a display area a thin-film transistor including an electrode, a non-display area adjacent to the display area, and a pad area in the non-display area, the pad area including: a lower conductive layer facing an upper conductive layer with an insulating layer therebetween, the lower conductive layer including: a first conductive layer defining an end surface of the display apparatus, and a second conductive layer in a different layer from the first conductive layer and spaced apart from the first conductive layer along the substrate to define a space therebetween, a lower insulating layer and a buffer layer both between the substrate and the first conductive layer, the buffer layer defines a buffer opening portion corresponding to the space which is between the first and second conductive layers, the lower insulating layer defines a lower opening portion corresponding to the space which is between the first and second conductive layers. The buffer opening portion and the lower opening portion are connected to each other, and the upper conductive layer is in a same layer as the electrode of the thin-film transistor and extends into both the buffer opening portion and the lower opening portion.

The upper conductive layer may be connected to the first conductive layer and the second conductive layer.

The insulating layer may be disposed between the lower insulating layer and the second conductive layer, the insulating layer includes an inner insulating layer and an outer insulating layer spaced apart from each other along the substrate, the inner insulating layer closer to the display area than the outer insulating layer, inner surfaces of the outer insulating layer and the inner insulating layer correspond to both the buffer opening portion and the lower opening portion and face each other, and the upper conductive layer extends from the buffer opening portion and the lower opening portion to be disposed along the inner surfaces of the outer insulating layer and the inner insulating layer.

The display apparatus may further include a planarization layer facing the insulating layer with the upper conductive layer therebetween. Within the pad area, an end of the upper conductive layer is farthest from the display area, and the planarization layer includes: an outer planarization layer corresponding to the end of upper conductive layer, and an inner planarization layer spaced apart from the outer planarization layer and corresponding to the display area.

BRIEF DESCRIPTION OF THE DRAWINGS

The above and other features and advantages of embodiments of the disclosure will be more apparent from the following description taken in conjunction with the accompanying drawings, in which.

DETAILED DESCRIPTION

Figure 1:
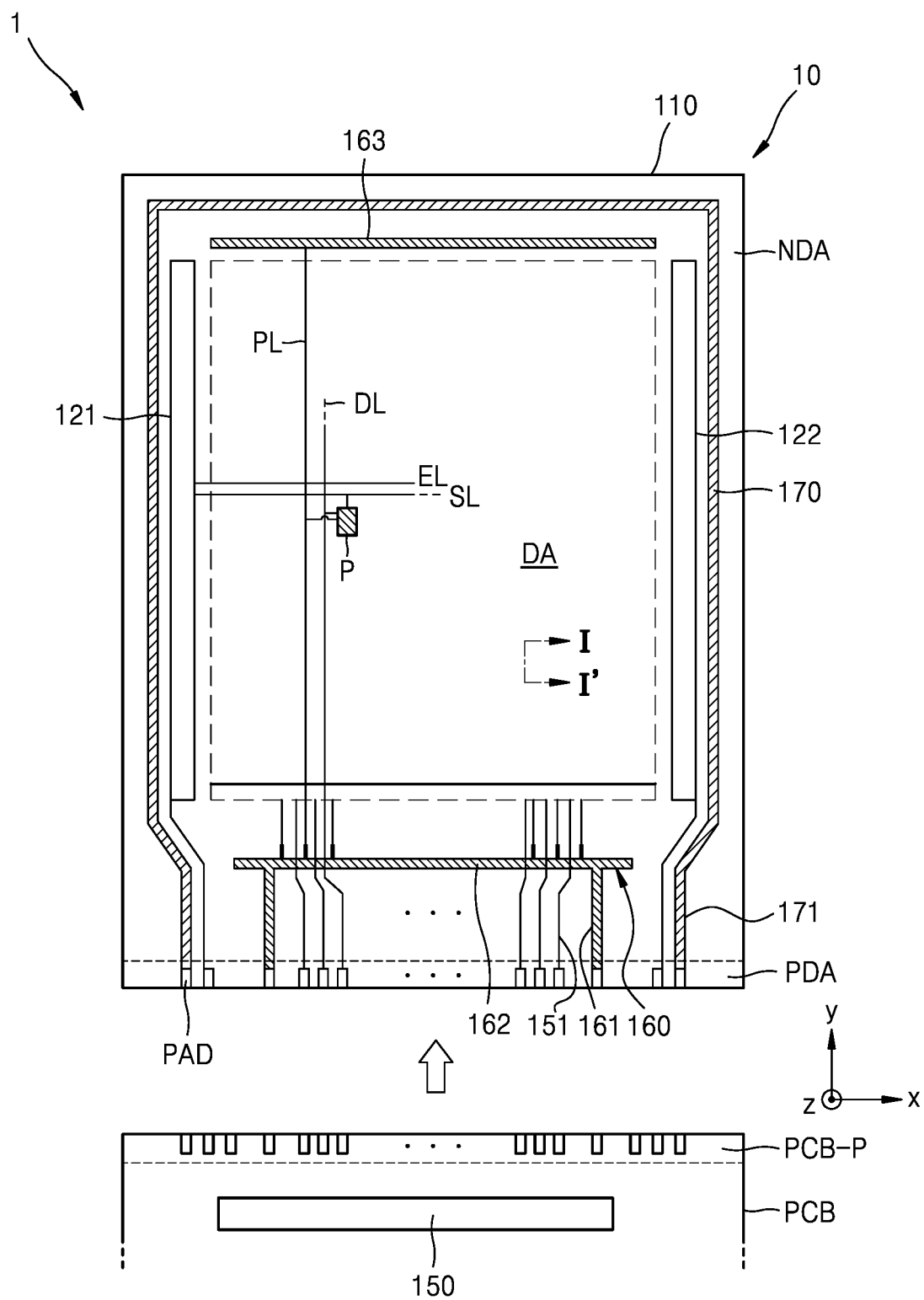
FIG. 1 is a schematic plan view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the present description.

The terminology used herein is for the purpose of describing particular embodiments only and is not intended to be limiting. As used herein, the singular forms "a," "an," and "the" are intended to include the plural forms as well, unless the context clearly indicates otherwise. For example, "an element" has the same meaning as "at least one element," unless the context clearly indicates otherwise. Expressions such as "at least one of," when preceding a list of elements, modify the entire list of elements and do not modify the individual elements of the list. As used herein, the term "and/or" includes any and all combinations of one or more of the associated listed items Hereinafter, the embodiments of the disclosure will be described in detail with reference to the accompanying drawings. In the descriptions, like reference numerals refer to the like elements and the same descriptions will not be repeated.

It will be understood that the terms "first," "second," etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components.

It will be understood that when a layer, area, or component is referred to as being related to another element such as being "on" another layer, area, or component, it can be directly or indirectly formed on the other layer, area, or component. That is, for example, intervening layers, areas, or components may be present. In contrast, when a layer, area, or component is referred to as being related to another element such as being related to another element such as being "directly on" another layer, area, or component, no intervening layers, areas, or components are present.

Sizes of elements in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being related to another element such as being "connected to" another element, area, or layer, an element, an area, or a layer may be in physical and/or mechanical contact with or electrically connected to another element, area, or layer.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic plan view of an embodiment of a display apparatus 1.

Referring to FIG. 1, the display apparatus 1 may include a display area DA (dotted line in FIG. 1) at which an image is generated and/or displayed, and a non-display area NDA at which an image is not displayed. The display apparatus 1 may provide an image by using light emitted from a pixel P provided in plurality (e.g., a plurality of pixels P) arranged in the display area DA.

Each of the pixels P may include a display element, such as an organic light-emitting diode ("OLEO"). Each pixel P may generate and/or emit light, for example, red, green, blue, and/or white light from the organic light-emitting diode ("OLED"). In this specification, the pixel P may be a pixel P at which any of red light, green light, blue light, and white light is emitted, as described above.

Each of the pixels P may be electrically connected to outer circuits arranged in the non-display area NDA. The outer circuits may include, but are not limited to, a first scan driving circuit 121, a second scan driving circuit 122, a pad area PDA, a data driving circuit 150, a first power supply line 160, and a second power supply line 170 arranged in the non-display area NDA.

The first scan driving circuit 121 outside the display area DA may provide a scan signal to each pixel P inside the display area DA, through a scan line SL which extends to be disposed in each of the display area DA and the non-display area NDA. Similarly, the first scan driving circuit 121 may provide an emission control signal to each pixel P through an emission control line EL. The second scan driving circuit 122 may be arranged parallel with the first scan driving circuit 121 with the display area DA therebetween. Some of the pixels P arranged in the display area DA may be electrically connected to the first scan driving circuit 121 and others of the pixels P may be electrically connected to the second scan driving circuit 122. According to another embodiment, the second scan driving circuit 122 may be omitted.

One or more of the aforementioned components may define a display panel 10 of the display apparatus 1. The display panel 10 and/or the components thereof may include a display area DA and a non-display area NDA corresponding to those described above. An electrical signal may be provided from outside the display panel 10, to the display area DA (e.g., the pixels P), to display an image, generate and/or emit light, etc.

The display apparatus 1, the display panel 10 and/or components thereof may be arranged along a plane defined by an x-direction and a y-direction which cross each other. A thickness of the display apparatus 1, the display panel 10 and/or components thereof may be defined along a z-direction. The x-direction, the y-direction and the z-direction may variously represent first to third directions which cross each other.

The pad area PDA may be arranged at a side of a substrate 110. A pad PAD may be provided in plurality (e.g., a plurality of pads PAD) arranged in the pad area PDA. Each of pads PAD of the pad area PDA may not be covered by an insulating layer, (e.g., may be exposed to outside the substrate 110), and may be electrically connected to a printed circuit board PCB. An electrical signal may be provided from outside the substrate 110 and/or the display panel 10, via the pads PAD, to various components of the display panel 10.

A terminal PCB-P (or terminal pad PCB-P) of the printed circuit board PCB may be electrically connected to a pad PAD of the display panel 10. An electrical signal such as a driving signal, a control signal, a power signal, a data signal, etc. may be provided to the display panel 10, from a controller (not shown). The printed circuit board PCB may be connected between the controller and the display panel 10, without being limited thereto. A control signal generated in the controller may be transmitted to each of the first and second scan driving circuits 121 and 122, through the printed circuit board PCB. In an embodiment, the controller may provide a first power voltage and a second power voltage to the first power supply line 160 and the second power supply line 170, respectively, through a first connection wire 161 (e.g., first connection wiring 161) and a second connection wire 171 (e.g., second connection wiring 171), otherwise referred to as first and second connection wires 161 and 171. The first power voltage may be provided to each pixel P through a driving voltage line PL connected to the first power supply line 160 and the second power voltage may be provided to an opposite electrode of each pixel P connected to the second power supply line 170.

The data driving circuit 150 may be electrically connected to a data line DL. A data signal of the data driving circuit 150 may be provided to each pixel P through a connection wire 151 (e.g., a third connection wire 151 or a third connection wiring 151) connected to the pad area PDA and through the data line DL connected to the connection wire 151. FIG. 1 illustrates that the data driving circuit 150 is arranged in the printed circuit board PCB. However, according to another embodiment, the data driving circuit 150 may be arranged on the substrate 110. In an embodiment, for example, the data driving circuit 150 may be arranged between the pad area PDA and the first power supply line 160.

The first power supply line 160 may include a first sub-line 162 and a second sub-line 163 extending parallel with each other along an x-direction with the display area DA therebetween. The second power supply line 170 may have a loop shape with one open side and may partially surround the display area DA. Referring to FIG. 1, the second power supply line 170 is open at a side of the display panel 10 at which the printed circuit board PCB is attachable to the display panel 10.

In order to increase the reliability of the display apparatus 1 described above, a substrate test of the display apparatus 1 may be performed, and a lighting test of the display apparatus 1 may be performed by using a test pad TPAD provided in plurality (e.g., a plurality of test pads TPAD). The test pad TPAD may be omitted from a display apparatus 1 and/or a display panel 10 which has been tested, without being limited thereto. Hereinafter, descriptions will be given in detail with reference to FIG. 2.

Figure 2:
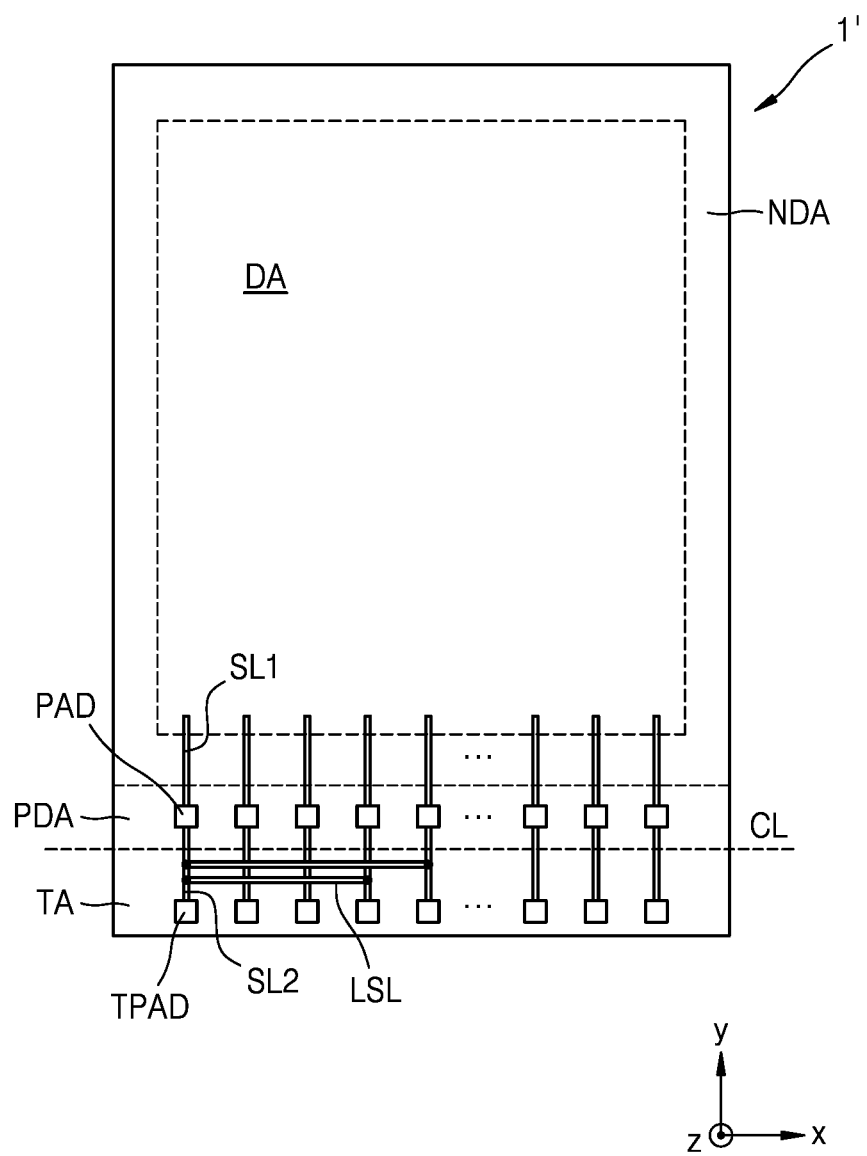
FIG. 2 is a schematic plan view of an embodiment of preliminary display apparatus on which a reliability test is performed.

FIG. 2 is a schematic plan view of an embodiment of a preliminary display apparatus 1' (hereinafter display apparatus 1') on which a process of a reliability test is performed.

Referring to FIG. 2, the display apparatus 1' may include a display area DA and a non-display area NDA corresponding to those of the display apparatus 1. The non-display area NDA may include a pad area PDA and a test area TA arranged with respect to a cutting line CL along which a portion of the display apparatus 1' may be separable from a remaining portion thereof. The cutting line CL may correspond to an end or edge of the display panel 10 and/or a component thereof, such as the substrate 110, without being limited thereto.

Within the display apparatus 1, a first end of a first signal line SL1 connected to a pixel P, a pad PAD connected to a second end of the first signal line SL1 which is opposite to the first end thereof, and a portion of a second signal line SL2 connected to the pad PAD and extending to the test area TA, may be arranged in the pad area PDA. One or more of the aforementioned elements, e.g., first signal lines SL1, pads PAD and second signal lines SL2 may be arranged in the pad area PDA.

The first signal lines SL1 may include the first and second connection wires 161 and 171 (refer to FIG. 1) and the connection wire 151 (refer to FIG. 1).

Portions of the second signal lines SL2 connected to the pads PAD, and test pads TPAD connected to the second signal lines SL2 may be arranged in the test area TA.

The second signal lines SL2 may be connected to one another via connection lines LSL. In an embodiment, for example, the connection lines LSL may connect a first group of the second signal lines SL2 with one another, the first group of the second signal lines SL2 being connected to the pixels P emitting the same color. Thus, whether the pixels P emit light or not may be tested by using a test signal applied to the test pads TPAD connected to the pixels P by one or more of the second signal lines SL2.

The cutting line CL may be arranged to cross the second signal lines SL2. Whether the display apparatus 1' operates or not may be tested by using the test pads TPAD, and the test pads TPAD alone or the test pads TPAD together with other layers of the display apparatus 1' may be separated from a remainder of the display apparatus 1' along the cutting line CL. The remainder of the display apparatus 1' from which the test pads TPAD alone or the test pads TPAD together with other layers of the display apparatus 1' are separated may define the display panel 10. That is, the display panel 10 of the display apparatus 1 in FIG. 1 may be a remaining portion of the display apparatus 1'.

Figure 3:
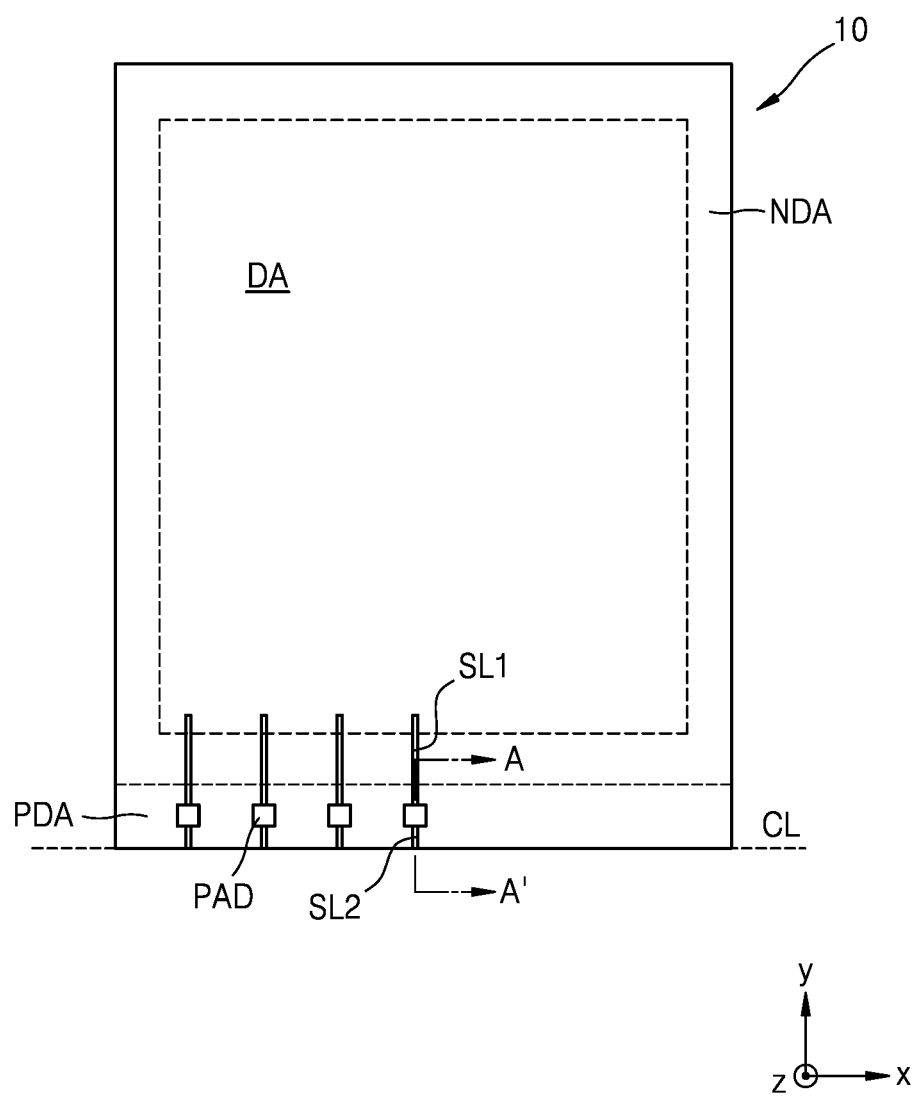
FIG. 3 is a plan view of an embodiment of a display apparatus provide from a preliminary display apparatus.
Figure 4A:
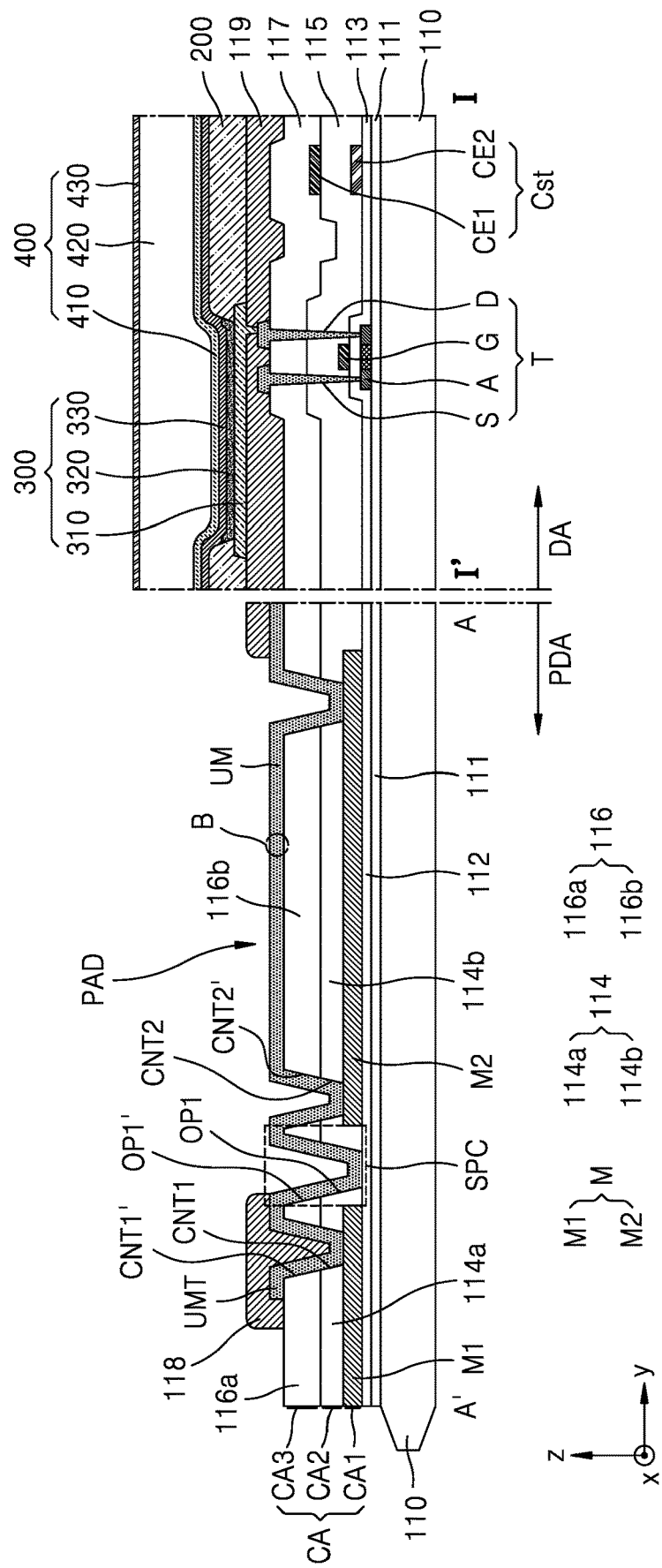
FIG. 4A is a cross-sectional view taken along line I-I' of FIG. 1 and line A-A' of FIG. 3.
Figure 4B:
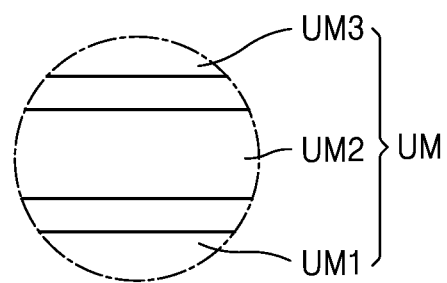
FIG. 4B is an enlarged cross-sectional view of portion B in FIG. 4A.

FIG. 3 is a plan view of the display apparatus 1 provided from the display apparatus 1'. FIG. 4A is a cross-sectional view taken along line I-I' of FIG. 1 and line A-A' of FIG. 3. FIG. 4B is an enlarged cross-sectional view of portion B in FIG. 4A.

Referring to FIG. 3, in a remaining portion of the display apparatus 1' (e.g., the display panel 10 of the display apparatus 1) first signal lines SL1, pads PAD, and portions of second signal lines SL2 may be arranged in a pad area PDA. The portions of the second signal lines SL2 may remain in the pad area PDA of the display panel 10 where ends of the portions of the second signal lines SL2 are aligned with an end of the substrate 110 which corresponds to a cutting line CL. That is, the ends of the portions of the second signal lines SL2 may define an end of the display panel 10 and/or the display apparatus 1.

Referring to FIGS. 4A and 4B, the pads PAD of the display apparatus 1 may include portions of the substrate 110, a buffer layer 111 (e.g., a first lower insulating layer), a lower layer 112 (e.g., lower insulating layer 112 or second lower insulating layer), a lower conductive layer M, a first insulating layer 114, a second insulating layer 116, an upper conductive layer UM, and a protective layer 118.

The substrate 110 may include glass or a polymer resin. The polymer resin may include polyethersulfone, polyacrylate, polyetherimide, polyethylene n naphthalate, polyethylene terephthalate, polyphenylene sulfide, polyarylate, polyimide, polycarbonate, cellulose acetate propionate, or the like. The substrate 110 including the polymer resin may be flexible, rollable, or bendable. The substrate 110 may have a multi-layered structure including a layer including one or more of the polymer resins described above and an inorganic layer (not shown).

The buffer layer 111 may be located on the substrate 110, may reduce or prevent penetration of foreign materials, moisture, or foreign substances from below (e.g., outside) the substrate 110, and may provide a planarized surface on the substrate 110. The buffer layer 111 may include an inorganic material, such as oxide or nitride, an organic material, or both the organic and the inorganic material, and may have a single-layered structure or a multi-layered structure including an inorganic material and/or an organic material. A barrier layer (not shown) reducing or preventing the penetration of foreign substances may further be included between the substrate 110 and the buffer layer 111. In some embodiments, the buffer layer 111 may include silicon oxide ($SiO_2$) or silicon nitride ($SiN_x$).

The lower layer 112 may be provided to cover the buffer layer 111. The lower layer 112 (e.g., a lower insulating layer 112) may include an inorganic insulating material, such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The lower layer 112 may include a single layer or layers including the organic insulating materials described above.

The lower conductive layer M may be arranged on an upper surface of the lower layer 112, the lower conductive layer M including a first conductive layer M1 and a second conductive layer M2 (e.g., first and second conductive layers M1 and M2).

According to the embodiment, the first conductive layer M1 and the second conductive layer M2 may be arranged in a same layer with a space SPC therebetween along the substrate 110. As being in "a same layer," elements may be provided or formed from a same material layer, such as to be portions of a same material layer on the substrate 110. Such portions being in a same layer may be disposed at a same distance from the substrate 110 as each other.

A side surface of the first conductive layer M1 may include a first cut surface CA1 (e.g., a first cut side surface CA1). Also, the first conductive layer M1 may include the first cut surface CA1 in the same plane as (e.g., coplanar with) a second cut surface CA2 (e.g., a second cut side surface CA2) of the first insulating layer 114 and/or a third cut surface CA3 (e.g., a third cut side surface CA3) of the second insulating layer 116 to be described below. Such cut surfaces may be exposed to outside the display panel 10, to define an end surface of the substrate 110, the display panel 10 and/or the display apparatus 1, without being limited thereto.

The second conductive layer M2 may be arranged to be apart from the first conductive layer M1 along the substrate 110 and may be arranged to be closer to the display area DA than the first conductive layer M1. Unlike the first conductive layer M1, the second conductive layer M2 may not include the first cut surface CA1. Also, the space SPC may be between the first conductive layer M1 and the second conductive layer M2. The first conductive layer M1 and the second conductive layer M2 may include Mo, Al, Cu, Ti, etc., and may include a single layer or layers. In an embodiment, for example, the first conductive layer M1 and the second conductive layer M2 may include a single Mo layer.

The first conductive layer M1 and the second conductive layer M2 may include a same material as a gate electrode G to be described below.

The first insulating layer 114 may cover the first conductive layer M1 and the second conductive layer M2. The first insulating layer 114 may have a first insulating layer-opening portion OP1 (e.g., first opening OP1) to correspond to the space SPC between the first conductive layer M1 and the second conductive layer M2.

The first insulating layer 114 may have a first portion 114a covering or corresponding to the first conductive layer M1 and a second portion 114b covering or corresponding to the second conductive layer M2.

A side of the first portion 114a which connects upper and lower surfaces thereof to each other may include or define the second cut surface CA2. As described above, the second cut surface CA2 may coincide with or be in a same plane as the first cut surface CA1.

The first portion 114a may be arranged to cover a side surface of the first conductive layer M1. In an embodiment, for example, side surfaces of the first conductive layer M1 may include the first cut surface CA1 and a second side surface opposite thereto which is closer to the display area DA than the first cut surface CA1. The second side surface of the first conductive layer M1 may contact the first portion 114a. The first portion 114a may cover the second side surface of the first conductive layer M1 and may be arranged at the space SPC. The first portion 114a may include or define a first portion contact hole CNT1 (e.g., first contact hole CNT1) exposing the first conductive layer M1. An upper conductive layer UM to be described below and the first conductive layer M1 may be connected to each other at the first portion contact hole CNT1.

The second portion 114b may be arranged to cover an upper surface and a side surface of the second conductive layer M2. The second portion 114b may cover one or more side surface of the second conductive layer M2 and may be arranged at a portion of the space SPC. Similarly to the first portion 114a, the second portion 114b may include a second portion contact hole CNT2 (e.g., second contact hole CNT2) exposing the second conductive layer M2. The upper conductive layer UM to be described below and the second conductive layer M2 may be connected to each other at the second portion contact hole CNT2.

The first insulating layer 114 including the first portion 114a and the second portion 114b may include an inorganic insulating material, such as $SiO_x$, $SiN_x$, SiON, $Al_2O_3$, $TiO_2$, $Ta_2O_5$, $HfO_2$, $ZnO_2$, etc. The first insulating layer 114 may include a single layer or layers including the organic insulating materials described above. The first insulating layer 114 may include a same material as a second gate insulating layer 115 to be described below. The first insulating layer 114 may be simultaneously provided or formed with the second gate insulating layer 115, to be disposed in a same layer as the second gate insulating layer 115, to be described below.

The first insulating layer-opening portion OP1 may be arranged in the first insulating layer 114 to correspond to the space SPC. A dimension of the first insulating layer-opening portion OP1 (e.g., distance along the substrate 110 taken between sidewalls of the first insulating layer 114 at the space SPC) may be smaller than a dimension of the space SPC (e.g., distance along the substrate 110 taken between sidewalls of the lower conductive layer M). In an embodiment, for example, a center of the first insulating layer-opening portion OP1 may correspond to a center of the space SPC. A distance between the center of the first insulating layer-opening portion OP1 and an end of the first insulating layer-opening portion OP1 (e.g., at a sidewall of the first insulating layer 114) may be less than a distance between the center of the space SPC and a side surface of the first conductive layer M1 as a sidewall of the lower conductive layer M. As another example, the distance between the center of the first insulating layer-opening portion OP1 and the end of the first insulating layer-opening portion OP1 may be less than a distance between the center axis of the space SPC and a side surface of the second conductive layer M2 as a sidewall of the lower conductive layer M.

The first insulating layer-opening portion OP1 may not overlap the first conductive layer M1 or the second conductive layer M2, that is, may be spaced apart therefrom along the substrate 110. The upper conductive layer UM to be described below may be arranged on and extend into the first insulating layer-opening portion OP1. Thus, the first conductive layer M1 and the second conductive layer M2 may be spaced apart and shielded from the upper conductive layer UM.

The second insulating layer 116 may cover the first insulating layer 114. Also, similarly to the first insulating layer 114, the second insulating layer 116 may include a first insulating portion 116a and a second insulating portion 116b. The second insulating layer 116 may have a second insulating layer-opening portion OP1' (e.g., second opening OP1') to correspond to the first insulating layer-opening portion OP1.

The first insulating portion 116a may be arranged on the first portion 114a. A side of the first insulating portion 116a may include the third cut surface CA3. As described above, the third cut surface CA3 may be disposed in a same plane as the first cut surface CA1. The first cut surface CA1, the second cut surface CA2 and the third cut surface CA3 may form a single side surface CA in a single plane, without being limited thereto.

In an embodiment, for example, side surfaces of the first insulating portion 116O may include the third cut surface CA3 and a second side surface opposite thereto which is closer to the display area DA than the third cut surface CA3 and disposed at the space SPC. Similarly to the first portion 114a, the first insulating portion 116a may include a first insulating portion contact hole CNT1' (e.g., third contact hole CNT1'). The first insulating portion contact hole CNT1' may be connected to the first portion contact hole CNT1, such as to form a single contact hole. Also, the upper conductive layer UM to be described below and the first conductive layer M1 may be connected to each other at the first insulating portion contact hole CNT1'.

The second insulating portion 116b may be arranged on the second portion 114b and may overlap the space SPC. Similarly to the second portion 114b, the second insulating portion 116b may include a second insulating portion contact hole CNT2' (e.g., fourth contact hole CNT2'). The second insulating portion contact hole CNT2' may be connected to the second portion contact hole CNT2 such as to form a single contact hole. Also, the upper conductive layer UM to be described below and the second conductive layer M2 may be connected to each other at the second insulating portion contact hole CNT2'.

However, embodiments are not limited thereto. There may be at least one of each of the second portion contact hole CNT2 and the second insulating portion contact hole CNT2'. Thus, there may be two single contact holes each provided by the second insulating portion contact hole CNT2' connected to the second portion contact hole CNT2 and each exposing the second conductive layer M2. The two single contact holes may be spaced apart from each other along the substrate 110. Like this, various modifications may be made.

The second insulating layer 116 including the first insulating portion 116a and the second insulating portion 116b may include $SiO_2$, $SiN_x$, $SiON$, $Al_2O_3$, $TiO_2$, $TA_2O_5$, $HfO_2$, or $ZnO_2$. The second insulating layer 116 may include a same material as an interlayer insulating layer 117 to be described below. The second insulating layer 116 may be simultaneously provided or formed with the interlayer insulating layer 117, to be disposed in a same layer as the interlayer insulating layer 117.

The second insulating layer-opening portion OP1' may be arranged in the second insulating layer 116 to correspond to the space SPC. The second insulating layer-opening portion OP1' may be connected to the first insulating layer-opening portion OP1 to form a single contact hole. Similarly to the first insulating layer-opening portion OP1, the upper conductive layer UM to be described below may be arranged on and extend into the second insulating layer-opening portion OP1'.

The upper conductive layer UM may be arranged on the second insulating layer 116 and may also be arranged in each of the first portion contact hole CNT1, the first insulating portion contact hole CNT1', the second portion contact hole CNT2, the second insulating portion contact hole CNT2', the first insulating layer-opening portion OP1, and the second insulating layer-opening portion OP1'. In an embodiment, for example, the upper conductive layer UM may be integrally or commonly arranged along each of the side surface of the first portion 114a, the side surface of the first insulating portion 116a, the side surface of the second portion 114b, and the side surface of the second insulating portion 116b, at the space SPC.

The upper conductive layer UM may be electrically connected to the first conductive layer M1 and the second conductive layer M2. The upper conductive layer UM may be connected to the first conductive layer M1 at the first portion contact hole CNT1 and the first insulating portion contact hole CNT1'. Also, the upper conductive layer UM may be connected to the second conductive layer M2 at the second portion contact hole CNT2 and the second insulating portion contact hole CNT2'. When the reliability test of the display apparatus 1 is performed, the upper conductive layer UM may be electrically connected to the first conductive layer M1 to transmit a test signal from the test pads TPAD to the pads PAD. The upper conductive layer UM may include or define a wire through which the test signal is transmitted from the pads PAD to the display area DA.

The upper conductive layer UM may be arranged at the space SPC to shield the first conductive layer M1 and the second conductive layer M2. According to an embodiment, the upper conductive layer UM may form a valley or recess to correspond to the space SPC. In an embodiment, for example, the upper conductive layer UM may contact the lower layer 112 or the buffer layer 111 at the space SPC.

The upper conductive layer UM may include a conductive material including Mo, Al, Cu, Ti, etc. and may include multiple layers or a single layer including one or more the conductive materials described above. According to an embodiment, the upper conductive layer UM may include a first layer UM1 including titanium (e.g., a first titanium layer UM1), a second layer UM2 including aluminum (e.g., an aluminum layer UM2) on the first titanium layer UM1, and a third layer UM3 including titanium (e.g., a second titanium layer UM3) on the aluminum layer UM2. The upper conductive layer UM may be simultaneously provided or formed with a source electrode S and a drain electrode D, to be disposed in a same layer as the source electrode S and the drain electrode D, to be described below.

The protective layer 118 may be arranged on the upper conductive layer UM and may at least partially overlap the upper conductive layer UM. The protective layer 118 may expose the upper conductive layer UM of the pads PAD to outside the protective layer 118, and the pads PAD of the display panel 10 may be electrically connected to a component of the display apparatus 1 such as a printed circuit board PCB.

The protective layer 118 may be arranged on an upper conductive layer tip UMT of the upper conductive layer UM which is an end of the upper conductive layer UM furthest from the display area DA (e.g., closest to an end or edge of the display panel 10 at which a component is attachable to the display panel 10). The protective layer 118 may be arranged on the upper conductive layer tip UMT to protect the upper conductive layer tip UMT. The protective layer 118 may extend further then the upper conductive layer tip UMT in a direction away from the display area DA, and may extend in a direction toward the display area DA to terminate at a position corresponding to the space SPC or a position outside of the space SPC.

The protective layer 118 may include a single layer or layers including an organic material or an inorganic material. The protective layer 118 may include benzocyclobutene, polyimide, hexamethyldisiloxane, polymethylmethacrylate, or a general-purpose polymer, such as polystyrene, a polymer derivate having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The protective layer 118 may be provided or formed on the display area DA, simultaneously with a planarization layer 119, to be disposed in a same layer as the planarization layer 119, to be described below.

Hereinafter, a stacked structure of the display area DA of the display apparatus 1 will be described in detail with reference to FIGS. 4A and 4B.

The buffer layer 111 described above may be arranged on the substrate 110 and a thin-film transistor T may be arranged on the buffer layer 111. The thin-film transistor T may include a semiconductor layer A, the gate electrode G, the source electrode S, and the drain electrode D.

Hereinafter, an example in which the thin-film transistor T includes a top gate-type thin-film transistor T is illustrated. However, the embodiment is not limited thereto and various types of thin-film transistors including a bottom gate-type thin-film transistor may be implemented.

Also, hereinafter, an example in which there is one thin-film transistor T is illustrated. However, embodiments are not limited thereto. According to embodiments, a display apparatus 1 may include two or more thin-film transistors T with respect to one pixel P. Various modifications may be made. In an embodiment, for example, in some embodiments, six to seven thin-film transistors T may be included with respect to one pixel P.

The semiconductor layer A may include amorphous silicon or polycrystalline silicon. According to another embodiment, the semiconductor layer A may include oxide of at least one material selected from In, Ga, Sn, Zr, V, Hf, Cd, Ge, Cr, Ti, and Zn. The semiconductor layer A may include a channel area, and a source area and a drain area which each have a relatively higher carrier concentration than the channel area.

The gate electrode G may be arranged on the semiconductor layer A with a first gate insulating layer 113 therebetween. The gate electrode G may include Mo, Al, Cu, Ti, etc., and may include a single layer or layers. In an embodiment, for example, the gate electrode G may include a single Mo layer.

The first gate insulating layer 113 may insulate the semiconductor layer A from the gate electrode G and may include $SiO_2$, $SiN_x$, SiON, $Al_2O_3$, $TiO_2$, $TA_2O_5$, $HfO_2$, or $ZnO_2$.

The lower conductive layer M may be simultaneously provided or formed with the gate electrode G, such as to be disposed in a same layer as the gate electrode G. Also, the lower layer 112 may be simultaneously provided or formed with the first gate insulating layer 113, such as to be disposed in a same layer as the first gate insulating layer 113.

A first electrode CE1 of a storage capacitor Cst may be provided or formed in a same layer as the gate electrode G, such as by including a same material as the gate electrode G, being provided or formed from a same material layer, etc. A second electrode CE2 of the storage capacitor Cst may overlap the first electrode CE1 with the second gate insulating layer 115 therebetween. As described above, the first insulating layer 114 may be simultaneously formed with the second gate insulating layer 115, so as to be disposed in a same layer as the second gate insulating layer 115.

FIG. 4A illustrates that the storage capacitor Cst does not overlap the thin-film transistor T. However, embodiments are not limited thereto. In an embodiment, for example, the storage capacitor Cst may overlap the thin-film transistor T. In some embodiments, the first electrode CE1 of the storage capacitor Cst may be integral with the gate electrode G (e.g., one of the first electrode CE1 and the gate electrode G extends to define a portion thereof as the other one of the first electrode CE1 and the gate electrode G). That is, the gate electrode G of the thin-film transistor T may function as the first electrode CE1 of the storage capacitor Cst.

The interlayer insulating layer 117 may cover the second electrode CE2. The interlayer insulating layer 117 may include $SiO_2$, $SiN_x$, SiON, $Al_2O_3$, $TiO_2$, $Ta_2O_5$, $HfO_2$, or $ZnO_2$. As described above, the interlayer insulating layer 117 may be simultaneously provided or formed with the second insulating layer 116, so as to be disposed in a same layer as the second insulating layer 116.

The source electrode S and the drain electrode D (e.g., electrode) may be arranged on the interlayer insulating layer 117. The source electrode S and the drain electrode D may include a conductive material including Mo, Al, Cu, Ti, etc., and may include multiple layers or a single layer including the materials described above. In an embodiment, for example, the source electrode S and the drain electrode D may include a multi-layered structure including Ti/Al/Ti. The upper conductive layer UM may be simultaneously provided or formed with the source electrode S or the drain electrode D, so as to be disposed in a same layer as the source electrode S or the drain electrode D.

The planarization layer 119 may be located on the source electrode S and the drain electrode D, and a display device 300 (e.g., display element 300) may be located on the planarization layer 119. The planarization layer 119 may include a single layer or multiple layers including an organic material. The organic material may include a general-purpose polymer such as polymethylmethacrylate or polystyrene, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Also, the planarization layer 119 may include a stacked structure of an inorganic insulating layer and an organic insulating layer. The protective layer 118 may be simultaneously provided or formed with the planarization layer 119 and may include the same material as the planarization layer 119 or may be disposed in a same layer as the planarization layer 119.

FIG. 4A illustrates that the planarization layer 119 is arranged between the thin-film transistor T and the display device 300. However, embodiments are not limited thereto and various modifications may be made. In an embodiment, for example, a lower planarization layer and an upper planarization layer may be arranged as a collective one of the planarization layer 119 between the thin-film transistor T and the display device 300.

The display device 300 may be located on the planarization layer 119 in the display area DA of the substrate 110, the display device 300 including a pixel electrode 310, an opposite electrode 330, and an emission layer 320 therebetween and including an emission area (e.g., a light emission area). The pixel electrode 310 may be electrically connected to the thin-film transistor T at an opening portion in the planarization layer 119. One or more of the display device 300, the pixel electrode 310, the opposite electrode 330, and the emission layer 320 may be provided in plurality within the display area DA, without being limited thereto.

The pixel electrode 310 may be a reflection electrode. In an embodiment, for example, the pixel electrode 310 may include a reflective layer including Ag, Mg, Al, Pt, Pd, Au, Ni, Nd, Ir, Cr, and a combination thereof, and a transparent or semi-transparent electrode layer on the reflective layer. The transparent or semi-transparent electrode layer may include at least one selected from indium tin oxide ("ITO"), indium zinc oxide ("IZO"), zinc oxide ("ZnO"), indium oxide ($In_2O_3$), indium gallium oxide ("IGO"), or aluminum zinc oxide ("AZO").

A pixel-defining layer 200 may be arranged on the planarization layer 119. The pixel-defining layer 200 may have or define an opening corresponding to a sub-pixel and/or to a pixel P. The opening in the pixel-defining layer 200 exposes a portion of the pixel electrode 310, to define the pixel P and/or a light emission area thereof. Also, the pixel-defining layer 200 may increase a distance along a thickness direction between edges of the pixel electrode 310 and the opposite electrode 330 which is on the pixel electrode 310 to reduce or prevent the occurrence of electrical arcs, etc., at the edges of the pixel electrode 310. The pixel-defining layer 200 may include an organic material, such as polyimide or hexamethyldisiloxane.

The emission layer 320 of the display device 300 may include a relatively low molecular-weight material or a relatively high molecular-weight material. When the emission layer 320 includes a relatively low molecular-weight material, the emission layer 320 may have a structure in which each of a hole injection layer ("HIL"), a hole transport layer ("HTL"), an emission layer ("EML"), an electron transport layer ("ETL"), and an electron injection layer ("EIL") is stacked as a single layer, or each of the HIL, HTL, EML, ETL, and EIL is stacked as multiple layers and may include various organic materials, such as copper phthalocyanine (CuPc), N,N'-Di (naphthalene-1-yl)-N,N'-diphenyl-benzidine (NPB), tris-8-hydroxyquinoline aluminum (Alq3), etc. These layers may be provided or formed by using a vapor deposition method.

When the emission layer 320 includes a relatively high molecular-weight material, the emission layer 320 may have a structure including, for example, an HTL and an EML. Here, the HTL may include poly (3,4-ethylenedioxythiophene), and the EML may include a polymer material, such as a poly-phenylenevinylene-based polymer material and a polyfluorene-based polymer material. The emission layer 320 may be provided or formed by using a screen printing method, an inkjet printing method, a laser induced thermal imaging ("LITI") method, etc.

The structure of the emission layer 320 is not necessarily limited thereto, and the emission layer 320 may have various structures. Also, the emission layer 320 may include an integral layer with respect to the plurality of pixel electrodes 310 where a single one of the emission layer 320 is commonly provided to the plurality of pixel electrodes 310, or may include layers patterned to correspond to the plurality of pixel electrodes 310, respectively, where a discrete one of the emission layer 320 corresponds to a pixel electrode 310.

The opposite electrode 330 may be arranged on the display area DA and may be arranged to cover the display area DA as illustrated in FIG. 4A. That is, the opposite electrode 330 may be an integral layer (e.g., a single one layer) with respect to a plurality of display devices 300 and may correspond to each of the plurality of pixel electrodes 310.

The opposite electrode 330 may include a transmissive electrode. In an embodiment, for example, the opposite electrode 330 may include a transparent or semi-transparent electrode and may include a metal thin film having a relatively low work function, such as Li, Ca, LiF/Ca, LiF/Al, Al, Ag, Mg, and a combination thereof.

When the pixel electrode 310 includes a reflection electrode and the opposite electrode 330 includes a transmissive electrode, the light emitted from the emission layer 320 may be front emission-type light emitted toward the opposite electrode 330. However, embodiments are not limited thereto and light emitted from the emission layer 320 may be rear emission-type light emitted toward the substrate 110. In this case, the pixel electrode 310 may include a transparent or semi-transparent electrode and the opposite electrode 330 may include a reflection electrode. Also, the display apparatus 1 may be a dual emission-type display apparatus for emitting light in both front and rear directions.

A thin-film encapsulation layer 400 may cover the display area DA and a portion of the non-display area NDA to reduce or prevent penetration of external moisture and oxygen to elements of the display device 300. The thin-film encapsulation layer 400 may include at least one organic encapsulation layer and at least one inorganic encapsulation layer. FIG. 4A illustrates an example in which the thin-film encapsulation layer 400 includes two inorganic encapsulation layers, for example, a first inorganic encapsulation layer 410 and a second inorganic encapsulation layer 430 (e.g., first and second inorganic encapsulation layers 410 and 430) and one organic encapsulation layer 420. However, the order of stacking and the number of layer are not limited to the embodiment illustrated in FIG. 4A.

The first inorganic encapsulation layer 410 may cover the opposite electrode 330 and may include $SiO_x$, $SiN_x$, and/or SiON. However, other layers, such as a capping layer, etc., may be arranged between the first inorganic encapsulation layer 410 and the opposite electrode 330. The first inorganic encapsulation layer 410 may be provided formed along the structure therebelow (e.g., to have a profile corresponding to a profile of the stacked structure which is underlying the first inorganic encapsulation layer 410), and thus, may have a non-flat upper surface as illustrated in FIG. 4A.

The organic encapsulation layer 420 may cover the first inorganic encapsulation layer 410. Unlike the first inorganic encapsulation layer 410, the organic encapsulation layer 420 may approximately have a flat upper surface. In detail, the organic encapsulation layer 420 may approximately have a flat upper surface at a portion corresponding to the display area DA. The organic encapsulation layer 420 may include at least one material selected from polyethylene terephthalate, polyethylene n naphthalate, polycarbonate, polyimide, polyethylene sulfonate, polyoxymethylene, polyarylate, and hexamethyldisiloxane.

The second inorganic encapsulation layer 430 may cover the organic encapsulation layer 420 and may include $SiO_2$, $SiN_x$, and/or SiON.

The thin-film encapsulation layer 400 defines a collective member including the first inorganic encapsulation layer 410, the organic encapsulation layer 420, and the second inorganic encapsulation layer 430. Thus, even when cracks occur in the thin-film encapsulation layer 400, the cracks may not be connected between the first inorganic encapsulation layer 410 and the organic encapsulation layer 420 or between the organic encapsulation layer 420 and the second inorganic encapsulation layer 430, owing to the multi-layered structure of the thin-film encapsulation layer 400 described above. Thus, generation of a path within the thin-film encapsulation layer 400 through which external water or oxygen penetrates into the display area DA and the non-display area may be prevented or minimized. The second inorganic encapsulation layer 430 may contact the first inorganic encapsulation layer 410 at an edge or end of the second inorganic encapsulation layer 430 located outside the display area DA. Thus, the organic encapsulation layer 420 may not be exposed to outside the thin-film encapsulation layer 400 and/or the display panel 10.

According to one or more embodiment, the upper conductive layer UM may be arranged to extend along and overlap the space SPC. The profile or shape of the upper conductive layer UM, such as a valley structure along the thickness direction, may increase the reliability of the display apparatus 1.

After testing of whether the display apparatus 1' operates or not (refer to FIG. 3), laser trimming, etc. may be performed to provide or form the first cut surface CA1 of the first conductive layer M1. Accordingly, the side surface of the first conductive layer M1 may be exposed to outside the display apparatus 1' via the first cut surface CA1. The first conductive layer M1 may include a relatively high-corrosive material, such as Mo, and thus, may easily corrode. In an embodiment, for example, when the first conductive layer M1 includes Mo, lifting-off of the first conductive layer M1 from underlying elements within the stacked structure of the display apparatus 1' may occur due to oxidation of Mo. When the first conductive layer M1 is corroded and lifted-off, the first portion 114a may also be lifted-off from underlying elements within the stacked structure of the display apparatus 1'.

Figure 5:
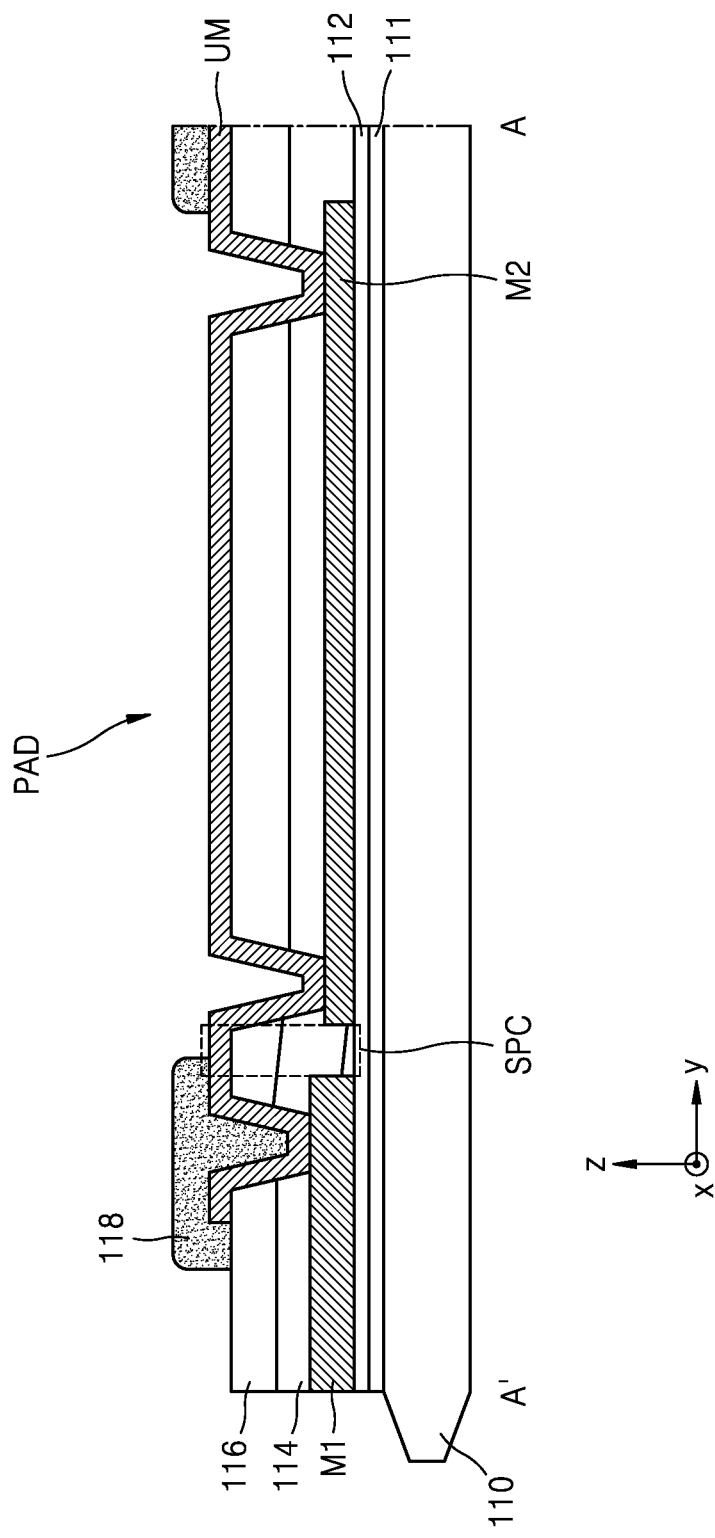
FIG. 5 shows a comparative example of display apparatus.

In a comparative embodiment illustrated in FIG. 5, when the upper conductive layer UM does not form a valley structure corresponding to the space SPC, the upper conductive layer UM may not shield the first conductive layer M1 and the second conductive layer M2. When the first conductive layer M1 corrodes and is lifted-off, the first insulating layer 114 may be lifted-off. When the first insulating layer 114 is lifted-off, corrosion may spread to the second conductive layer M2 of the pads PAD. Thus, the second conductive layer M2 may also corrode.

In order to minimize this phenomenon, according to one or more embodiment, the first insulating layer-opening portion OP1 and the second insulating layer-opening portion OP1' may be provided. Also, the upper conductive layer UM shielding the first conductive layer M1 and the second conductive layer M2 may be arranged at the space SPC. Since the upper conductive layer UM forms the valley structure at the first insulating layer-opening portion OP1 and the second insulating layer-opening portion OP1' and at the space SPC, even when the first conductive layer M1 corrodes, the second conductive layer M2 as underlying the first conductive layer M1 may not corrode. Thus, the display apparatus 1 including the pad area PDA including the conductive material, which is provided from the display apparatus 1 including the test pads TPAD, may have the increased reliability.

Figure 6A:
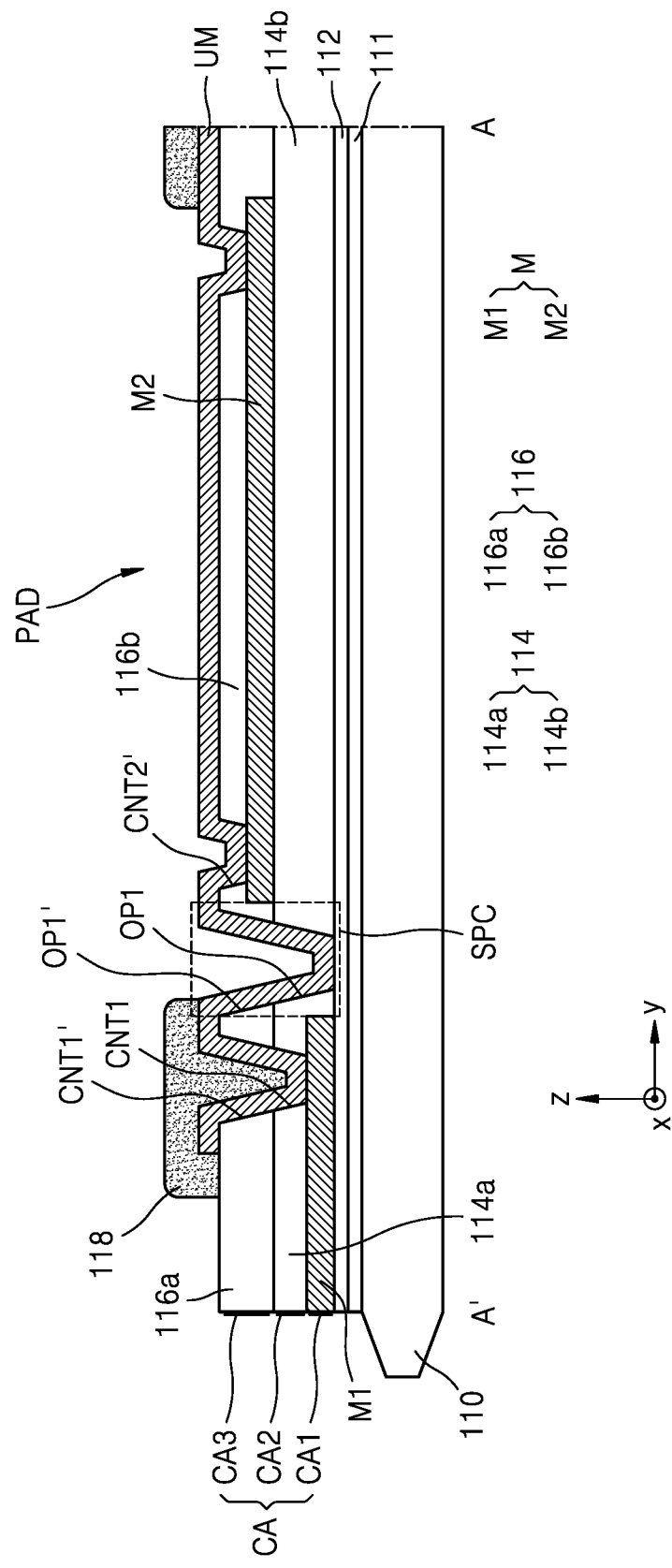
FIG. 6A is a cross-sectional view of another embodiment of a pad area of a display apparatus.

FIG. 6A is a cross-sectional view of another embodiment of a pad area PDA of a display apparatus 1. In FIG. 6A, reference numerals that are the same as the reference numerals in FIGS. 4A and 4B denote the members that are the same as the members in FIGS. 4A and 4B, and thus, their descriptions will not be repeated.

Referring to FIG. 6A, pads PAD of the display apparatus 1 may include a first conductive layer M1 and a second conductive layer M2 spaced apart from the first conductive layer M1 along a thickness direction. Also, a first insulating layer-opening portion OP1 and a second insulating layer-opening portion OP1' may be provided corresponding to a space SPC between the first conductive layer M1 and the second conductive layer M2. An upper conductive layer UM shielding the first conductive layer M1 and the second conductive layer M2 may be arranged at the space SPC between the first conductive layer M1 and the second conductive layer M2.

According to one or more embodiment, the first conductive layer M1 and the second conductive layer M2 may be arranged in different layers from each other, among single material layers provided on the substrate 110. In an embodiment, for example, the first conductive layer M1 may be arranged between the lower layer 112 and the first insulating layer 114. The second conductive layer M2 may be arranged between the first insulating layer 114 and the second insulating layer 116. However, it is not limited thereto. In another embodiment, for example, the first conductive layer M1 may be arranged between the first insulating layer 114 and the second insulating layer 116 and the second conductive layer M2 may be arranged between the lower layer 112 and the first insulating layer 114. As another example, the first conductive layer M1 and the second portion 114b may be arranged on the same layer.

The second conductive layer M2 may include a second insulating portion contact hole CNT2' within the pad PAD.

The second conductive layer M2 may be connected to the upper conductive layer UM at the second insulating portion contact hole CNT2'.

Since the first conductive layer M1 and the second conductive layer M2 are arranged in different layers from each other, even when the first conductive layer M1 is exposed to the outside and oxidized, the oxidation may not spread to the second conductive layer M2. In an embodiment, for example, even when a first portion 114a or the first insulating portion 116a above the first conductive layer M1 is lifted-off, the second conductive layer M2 may not be affected.

Figure 6B:
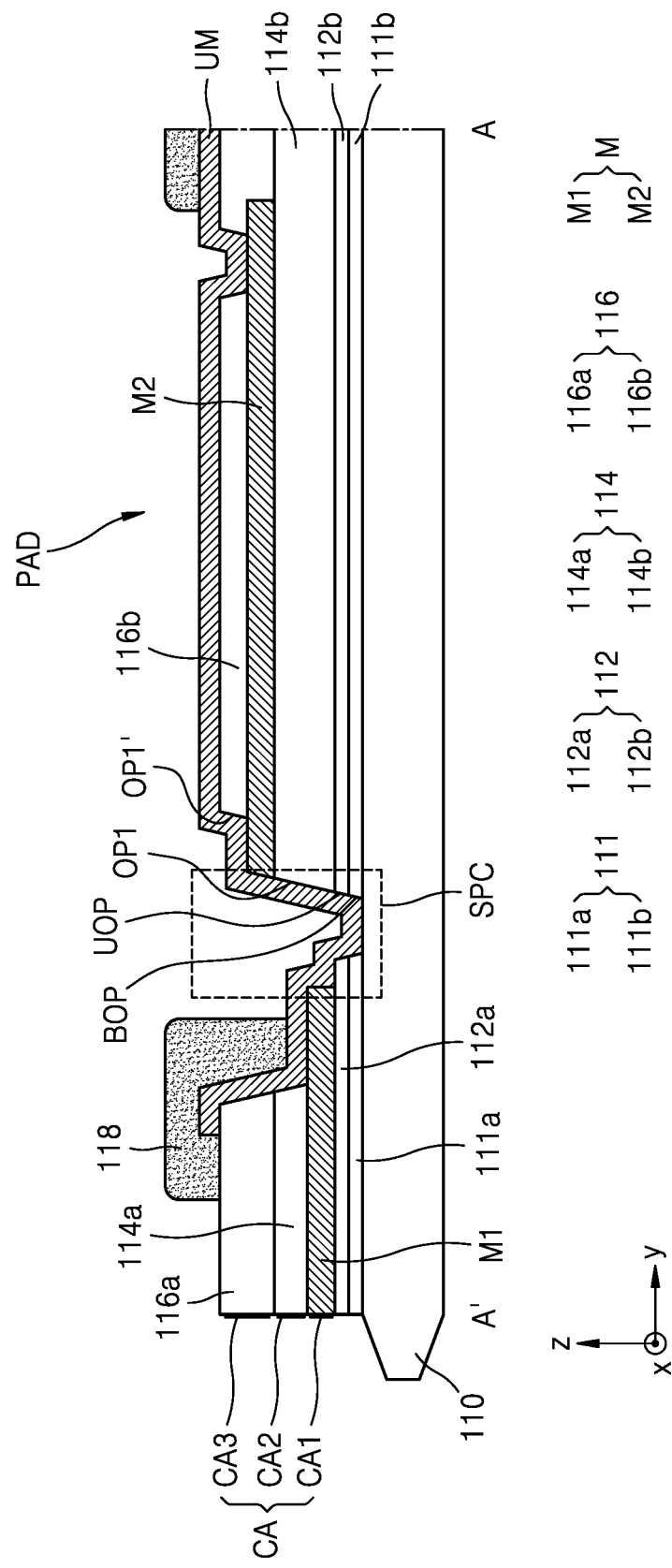
FIG. 6B is a cross-sectional view of still another embodiment of a pad area of a display apparatus.

FIG. 6B is a cross-sectional view of still another embodiment of a pad area PDA of a display apparatus 1.

In FIG. 6B, reference numerals that are the same as the reference numerals in FIGS. 4A and 4B denote the members that are the same as the members in FIGS. 4A and 4B, and thus, their descriptions will not be repeated.

Referring to FIG. 6B, a pad PAD of the display apparatus 1 may include a first conductive layer M1 and a second conductive layer M2 spaced apart from the first conductive layer M1. Also, a first insulating layer-opening portion OP1 and a second insulating layer-opening portion OP1' may be provided at a space SPC between the first conductive layer M1 and the second conductive layer M2, and an upper conductive layer UM shielding the first conductive layer M1 and the second conductive layer M2 may be arranged at the space SPC and extending into the space SPC between the first conductive layer M1 and the second conductive layer M2.

A buffer layer 111 may include a first buffer layer portion 111a and a second buffer layer portion 111b. The first buffer layer portion 111a may be arranged between the substrate 110 and the first conductive layer M1. The second buffer layer portion 111b may be arranged between the substrate 110 and the second conductive layer M2. The second buffer layer portion 111b may be arranged to be closer to the display area DA than the first buffer layer portion 111a.

A lower layer 112 may include a first lower layer portion 112a and a second lower layer portion 112b. The first lower layer portion 112a may be arranged between the first buffer layer portion 111a and the first conductive layer M1. The second lower layer portion 112b may be arranged between the second buffer layer portion 111b and the second conductive layer M2. The second lower layer portion 112b may be arranged closer to the display area DA than the first lower layer portion 112a.

The buffer layer 111 may include a buffer opening portion BOP corresponding to the space SPC. The buffer opening portion BOP (e.g., buffer layer opening BOP) may be arranged between the first buffer layer portion 111a and the second buffer layer portion 111b. The lower layer 112 may include a lower opening portion UOP (e.g., lower layer opening UOP) corresponding to the space SPC. The lower opening portion UOP may be arranged between the first lower layer portion 112a and the second lower layer portion 112b.

The buffer opening portion BOP and the lower opening portion UOP may be connected to each other. The lower opening portion UOP may be connected to the first insulating layer-opening portion OP1. Thus, the buffer opening portion BOP, the lower opening portion UOP, the first insulating layer-opening portion OP1, and the second insulating layer-opening portion OP' may form one single and continuous opening portion.

A width of the first insulating layer-opening portion OP1 may be greater than a width of the lower opening portion UOP. A width of the second insulating layer-opening portion OP1' may be greater than the width of the first insulating layer-opening portion OP1. The width of the second insulating layer-opening portion OP1' may be greater than a dimension (e.g., width) of the space SPC. The widths may be taken in a direction along the substrate 110 (e.g., horizontal in FIG. 6B).

The upper conductive layer UM may be arranged at the buffer opening portion BOP and the lower opening portion UOP. Thus, the upper conductive layer UM may contact the substrate 110 at the buffer opening portion BOP and shield the first conductive layer M1 and the second conductive layer M2.

The upper conductive layer UM may be an integral layer provided or formed extended along side surfaces of the first buffer layer portion 111a, the second buffer layer portion 111b, the first lower layer portion 112a, and the second lower layer portion 112b, at the space SPC. Also, the upper conductive layer UM may be arranged along the side surface of the second portion 114b at the space SPC.

The upper conductive layer UM may be connected to each of the first conductive layer M1 and the second conductive layer M2. The upper conductive layer UM may be arranged at an upper surface and extended to be disposed along the side surface of the first conductive layer M1. Also, the upper conductive layer UM may be arranged at the upper surface and extended to be disposed along the side surface of the second conductive layer M2 at the space SPC.

After testing whether or not the display apparatus 1' operates, laser trimming, etc. may be performed to provided or form a first cut surface CA1 of the display apparatus 1. Even when the first conductive layer M1 corrodes since the first conductive layer M1 is exposed through the first cut surface CA1, the corrosion may not spread to the second conductive layer M2.

Figure 7:
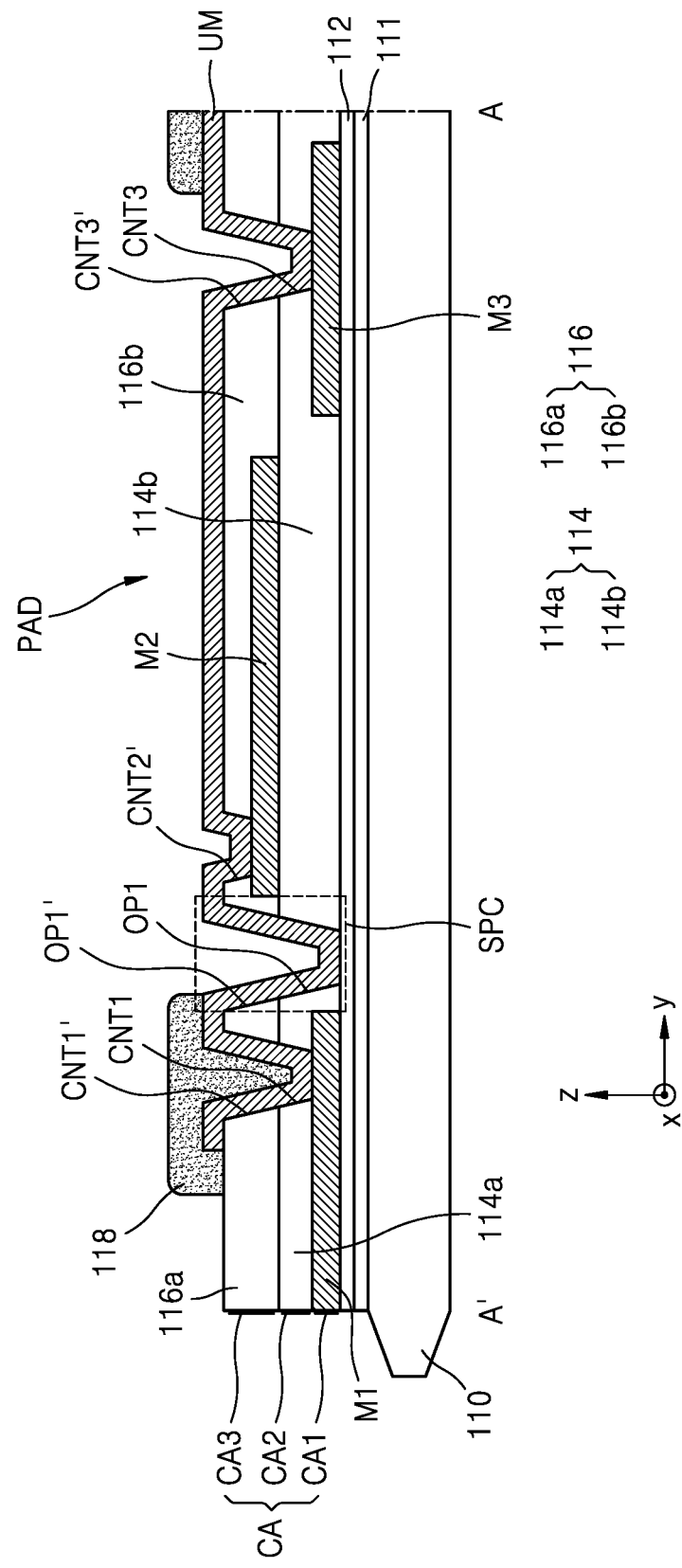
FIG. 7 is a cross-sectional view of yet another embodiment of a pad area of a display apparatus.

FIG. 7 is a cross-sectional view of yet another embodiment of a pad area PDA of a display apparatus 1. In FIG. 7, reference numerals that are the same as the reference numerals in FIGS. 4A and 4B denote the members that are the same as the members in FIGS. 4A and 4B, and thus, their descriptions will not be repeated.

Referring to FIG. 7, a pad PAD of the display apparatus 1 may include a first conductive layer M1 and a second conductive layer M2 spaced apart from the first conductive layer M1. Also, a first insulating layer-opening portion OP1 and a second insulating layer-opening portion OP1' may be provided at a space SPC between the first conductive layer M1 and the second conductive layer M2, and an upper conductive layer UM shielding the first conductive layer M1 and the second conductive layer M2 may be arranged at the space SPC between the first conductive layer M1 and the second conductive layer M2.

According to one or more present embodiment, a third conductive layer M3 may be arranged below the second conductive layer M2. In an embodiment, for example, the third conductive layer M3 may be arranged in the same layer as the first conductive layer M1 and may be arranged to be closer to the display area DA than the second conductive layer M2. As another example, the third conductive layer M3 may contact the lower layer 112, but is not limited thereto. The third conductive layer M3 may be arranged between a buffer layer 111 and a lower layer 112. Like this, various modifications may be made.

A third portion contact hole CNT3 of a first insulating layer 114 and a third insulating portion contact hole CNT3' of a second insulating layer 116 may be arranged corresponding to the third conductive layer M3. The third portion contact hole CNT3 and the third insulating portion contact hole CNT3' may be connected to each other. The third conductive layer M3 may be connected to the upper conductive layer UM at the third portion contact hole CNT3 and the third insulating portion contact hole CNT3'.

The above arrangement of the first conductive layer M1, the second conductive layer M2, and the third conductive layer M3 (e.g., first, second and third conductive layers M1, M2 and M3) may alleviate the height difference of the pads PAD. Also, even when a first cut surface CA1 of the first conductive layer M1 is exposed and corrodes, the corrosion of the first conductive layer M1 may not spread to the second conductive layer M2 or the third conductive layer M3.

The display apparatus 1 according to one or more embodiment has been described by using the terms, such as the first buffer layer portion 111a, the second buffer layer portion 111b, the first lower layer portion 112a, the second lower layer portion 112b, the first portion 114a, the second portion 114b, the first insulating portion 116a, the second insulating portion 116b, etc. However, embodiments are not limited thereto. In an embodiment, for example, the first portion 114a may be understood as a first outer insulating layer, the second portion 114b as a first inner insulating layer, the first insulating portion 116a as a second outer insulating layer, the second insulating portion 116b as a second inner insulating layer, the first buffer layer portion 111a and the first lower layer 112a as outer lower layers, and the second buffer layer portion 111b and the second lower layer 112b as inner lower layers. Portions being described as "inner" may be closer to the display area DA than portions being described as "outer."

In an embodiment, for example, referring to FIG. 4A, the insulating layer (114 and 116) includes an outer insulating layer portion (114a and 116a) which corresponds to the first conductive layer M1 and an inner insulating layer portion (114b and 116b) which corresponds to the second conductive layer M2 and is spaced apart from the outer insulating layer (114a and 116a) along the substrate 110. Outer side surfaces of the first conductive layer M1 and the outer insulating layer (114a and 116a) are defined at an end of the display apparatus 1 (e.g., at side surface CA) and are coplanar with each other. An inner side surface of the outer insulating layer (114a and 116a) is opposite to the outer side surface thereof, and an inner side surface of the inner insulating layer (114b and 116b) faces the inner side surface of the outer insulating layer 114a and 116a) at the space SPC. The upper conductive layer UM commonly extends from upper surfaces of each of the outer and inner insulating layers and along the inner side surfaces thereof which face each other.

In an embodiment, for example, referring to FIG. 6B, the insulating layer (e.g., 114 and 116) includes an inner insulating layer (114b and 116b) and an outer insulating layer (114a and 116a) spaced apart from each other along the substrate 110, the inner insulating layer (114b and 116b) is closer to the display area DA than the outer insulating layer (114a and 116a), inner surfaces of the outer insulating layer (114a and 116a) and the inner insulating layer (114b and 116b) correspond to both the buffer opening portion BOP and the lower opening portion UOP and face each other (e.g., at the space SPC), and the upper conductive layer UM extends from the buffer opening portion BOP and the lower opening portion UOP to be disposed along the inner surfaces of the outer insulating layer (114a and 114b) and the inner insulating layer 114b and 116b).

The display apparatus 1 according to one or more embodiment may include a pad area PDA including an insulating layer opening structure and an upper conductive layer UM covering the insulating layer opening structure. Thus, the display apparatus 1 including the pad area PDA including the conductive material at the upper conductive layer UM may have the increased reliability against corrosion, lifting-off, etc.

However, the described effect is an example, and the scope of the disclosure is not limited thereto.

As described above, a first end of a first signal line SL1 is connected to a pixel P, and a pad PAD is connected to a second end of the first signal line SL1. In an embodiment, the upper conductive layer UM, the second conductive layer M2 and/or the third conductive layer M3 may correspond to first signal lines SL1 (FIG. 2) through which an electrical signal is provided from the pad area PDA to the display area DA. In an embodiment, the upper conductive layer UM may be extended from the pad area PDA to the display area DA, to be connected to the pixel P (e.g., at the thin film transistor T), without being limited thereto. As described above, a portion of a second signal line SL2 is connected to the pad PAD and extends to the test area TA. In an embodiment, first conductive layer M1 may correspond to portions of the second signal lines SL2 (FIG. 2) through which an electrical signal is provided from the test area TA to the pad area PDA, without being limited thereto.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate comprising:
   a display area comprising a thin-film transistor including an electrode,
   a non-display area adjacent to the display area, and
   a pad area in the non-display area and including a lower conductive layer and an upper conductive layer facing each other with an insulating layer therebetween,
   wherein
   the lower conductive layer includes:
   a first conductive layer defining an end surface of the display apparatus, and
   a second conductive layer which is closest to the first conductive layer along the substrate and spaced apart from the first conductive layer along the substrate to define a space between the first and second conductive layers,
   the insulating layer defines a first opening portion corresponding to the space between the first and second conductive layers, and
   the upper conductive layer in the pad area is in a same layer as the electrode of the thin-film transistor in the display area, the upper conductive layer extending into the first opening portion corresponding to the space between the first and second conductive layers.

2. The display apparatus of claim 1, wherein within the pad area,
   the insulating layer defines a first contact hole and a second contact hole spaced apart from each other along the substrate, and the upper conductive layer is connected to the first conductive layer at the first contact hole and connected to the second conductive layer at the second contact hole.

3. The display apparatus of claim 1, wherein within the pad area, the insulating layer is provided in plurality including a first insulating layer and a second insulating layer arranged along a thickness direction of the substrate.

4. The display apparatus of claim 3, wherein corresponding to the space between the first and second conductive layers within the pad area,
the first opening portion includes a first insulating opening portion defined in the first insulating layer and a second insulating opening portion defined in the second insulating layer, and
the first insulating opening portion and the second insulating opening portion are connected to each other at the space.

5. The display apparatus of claim 1, wherein
the display area further comprises within the thin-film transistor:
a gate electrode facing the electrode with both a gate insulating layer and an interlayer insulating layer therebetween, and
a semiconductor layer facing the gate insulating layer with the gate electrode therebetween, and
in the pad area, the insulating layer is provided in plurality including:
a first insulating layer in a same layer as the gate insulating layer, and
a second insulating layer in a same layer as the interlayer insulating layer.

6. The display apparatus of claim 1, further comprising a lower insulating layer between the first conductive layer and the substrate.

7. The display apparatus of claim 1, wherein within the pad area, an end of the upper conductive layer is farthest from the display area,
further comprising in the pad area, a protective layer including an organic material and facing the insulating layer with the upper conductive layer therebetween, the protective layer covering the end of the upper conductive layer.

8. The display apparatus of claim 1, wherein the first conductive layer and the second conductive layer are in different layers from each other.

9. The display apparatus of claim 8, wherein
the display area further comprises within the thin-film transistor:
a gate electrode facing the electrode with both a gate insulating layer and an interlayer insulating layer therebetween, and
a semiconductor layer facing the gate insulating layer with the gate electrode therebetween, and
in the pad area, the insulating layer is provided in plurality including:
a first insulating layer in a same layer as the gate insulating layer, the first insulating layer disposed between the substrate and the second conductive layer, and
a second insulating layer in a same layer as the interlayer insulating layer, the second insulating layer facing the first insulating layer with the second conductive layer therebetween.

10. The display apparatus of claim 9, further comprising in the pad area, a lower insulating layer and a buffer layer both between the first insulating layer and the substrate, wherein the buffer layer defines a buffer opening portion corresponding to the space between the first and second conductive layers,
the lower insulating layer defines a lower opening portion corresponding to the space between the first and second conductive layers,
the buffer opening portion and the lower opening portion are connected to each other, and
at the space, the upper conductive layer extends from upper surfaces of each of the first conductive layer and the second conductive layer and along side surfaces of each of the first conductive layer and the second conductive layer, to be disposed in the buffer opening portion and the lower opening portion connected to each other.

11. The display apparatus of claim 8, wherein
the lower conductive layer further includes a third conductive layer spaced apart along the substrate from the first conductive layer with the second conductive layer therebetween,
the third conductive layer closer to the display area than the second conductive layer, and
the upper conductive layer is commonly connected to each of the first, second and third conductive layers.

12. The display apparatus of claim 11, further comprising a lower insulating layer between the first conductive layer and the substrate and between the third conductive layer and the substrate.

13. A display apparatus comprising:
a substrate comprising:
a display area;
a non-display area which is adjacent to the display area; and
a pad area in the non-display area and including a lower conductive layer and an upper conductive layer facing each other with an insulating layer therebetween,
wherein
the lower conductive layer includes:
a first conductive layer defining an end surface of the display apparatus, and
a second conductive layer which is closest to the first conductive layer along the substrate, spaced apart from the first conductive layer along the substrate, and closer to the display area than the first conductive layer,
the insulating layer includes an outer insulating layer which corresponds to the first conductive layer and an inner insulating layer which corresponds to the second conductive layer and is spaced apart from the outer insulating layer along the substrate,
outer side surfaces of the first conductive layer and the outer insulating layer are defined at an end of the display apparatus and are coplanar with each other,
an inner side surface of the outer insulating layer is opposite to the outer side surface thereof, and an inner side surface of the inner insulating layer faces the inner side surface of the outer insulating layer, and
the upper conductive layer commonly extends from upper surfaces of each of the outer and inner insulating layers and along the inner side surfaces thereof which face each other.

14. The display apparatus of claim 13, wherein within the pad area,
the outer insulating layer defines a first contact hole exposing the first conductive layer, the inner insulating layer defines a second contact hole exposing the second conductive layer, and the upper conductive layer is connected to the first conductive layer at the first contact hole, and is connected to the second conductive layer at the second contact hole.

15. The display apparatus of claim 13, wherein within the pad area, the outer insulating layer is provided in plurality including a first outer insulating layer and a second outer insulating layer, and the inner insulating layer is provided in plurality including:

a first inner insulating layer spaced apart from the first outer insulating layer along the substrate, and a second inner insulating layer spaced apart from the second outer insulating layer along the substrate.

16. The display apparatus of claim 13, further comprising a planarization layer facing the insulating layer with the upper conductive layer therebetween, wherein within the pad area, an end of the upper conductive layer is farthest from the display area, and the planarization layer includes:

an outer planarization layer corresponding to the end of upper conductive layer, and an inner planarization layer spaced apart from the outer planarization layer along the substrate and corresponding to the display area.

17. The display apparatus of claim 13, further comprising in the pad area, a lower insulating layer between the first conductive layer and the substrate, wherein in the pad area, the insulating layer defines an opening at which the upper conductive layer and the lower insulating layer contact each other.

18. The display apparatus of claim 13, wherein within the pad area, the first conductive layer and the second conductive layer are in different layers from each other with the insulating layer therebetween.

19. The display apparatus of claim 18, further comprising in the pad area, a first lower insulating layer between the first conductive layer and the substrate, and a second lower insulating layer between the second conductive layer and the first lower insulating layer.

20. The display apparatus of claim 13, further comprising in the pad area, a lower insulating layer between the second conductive layer and the substrate, the lower insulating layer including an outer lower insulating layer portion which corresponds to the first conductive layer and an inner lower insulating layer portion which corresponds to the second conductive layer, wherein within the pad area, an inner side surface of the outer lower insulating layer portion faces an inner side surface of the inner lower insulating layer portion, and the upper conductive layer commonly extends from upper surfaces of each of the outer and inner lower insulating layer portions and along the inner side surfaces thereof which face each other.

21. The display apparatus of claim 18, wherein within the pad area, the lower conductive layer further includes a third conductive layer between the display area and the second conductive layer along the substrate, the third conductive layer is in a same layer as the first conductive layer, the inner insulating layer defines a third contact hole exposing the third conductive layer, and the third conductive layer is connected to the upper conductive layer at the third contact hole.

22. The display apparatus of claim 21, further comprising in the pad area, a lower insulating layer between the third conductive layer and the substrate, wherein the third conductive layer and the lower insulating layer contact each other.

23. A display apparatus comprising:

a substrate comprising:

a display area comprising a thin-film transistor including an electrode, a non-display area adjacent to the display area, and a pad area in the non-display area, the pad area including:

a lower conductive layer facing an upper conductive layer with an insulating layer therebetween, the lower conductive layer including:

a first conductive layer defining an end surface of the display apparatus, and a second conductive layer in a different layer from the first conductive layer and spaced apart from the first conductive layer along the substrate to define a space therebetween, a lower insulating layer and a buffer layer both between the substrate and the first conductive layer, the buffer layer defines a buffer opening portion corresponding to the space which is between the first and second conductive layers, and the lower insulating layer defines a lower opening portion corresponding to the space which is between the first and second conductive layers, wherein the buffer opening portion and the lower opening portion are connected to each other, and the upper conductive layer is in a same layer as the electrode of the thin-film transistor and extends into both the buffer opening portion and the lower opening portion.

24. The display apparatus of claim 23, wherein within the pad area, the upper conductive layer is commonly connected to the first conductive layer and the second conductive layer.

25. The display apparatus of claim 24, wherein within the pad area, the insulating layer is disposed between the lower insulating layer and the second conductive layer, the insulating layer includes an inner insulating layer and an outer insulating layer spaced apart from each other along the substrate, the inner insulating layer closer to the display area than the outer insulating layer, inner surfaces of the outer insulating layer and the inner insulating layer correspond to both the buffer opening portion and the lower opening portion and face each other, and the upper conductive layer extends from the buffer opening portion and the lower opening portion to be disposed along the inner surfaces of the outer insulating layer and the inner insulating layer.

26. The display apparatus of claim 23, further comprising a planarization layer facing the insulating layer with the upper conductive layer therebetween, wherein within the pad area, an end of the upper conductive layer is farthest from the display area, and the planarization layer includes:
- an outer planarization layer corresponding to the end of upper conductive layer, and
- an inner planarization layer spaced apart from the outer planarization layer and corresponding to the display area.

* * * * *